United States Patent
Mai et al.

(10) Patent No.: US 9,128,117 B2
(45) Date of Patent: Sep. 8, 2015

(54) LASER-ENHANCED CHEMICAL ETCHING OF NANOTIPS

(71) Applicant: GLOBALFOUNDRIES Singapore Pte. Ltd., Singapore (SG)

(72) Inventors: ZhiHong Mai, Singapore (SG); Jeffrey C. Lam, Singapore (SG); Mohammed Khalid Bin Dawood, Singapore (SG); Tsu Hau Ng, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/097,211

(22) Filed: Dec. 4, 2013

(65) Prior Publication Data

US 2014/0242805 A1    Aug. 28, 2014

Related U.S. Application Data

(60) Provisional application No. 61/769,760, filed on Feb. 27, 2013.

(51) Int. Cl.
*H01L 21/302* (2006.01)
*G01Q 70/16* (2010.01)
*B82Y 35/00* (2011.01)
*C25F 3/08* (2006.01)

(52) U.S. Cl.
CPC ............ *G01Q 70/16* (2013.01); *B82Y 35/00* (2013.01); *C25F 3/08* (2013.01)

(58) Field of Classification Search
CPC ......... B82Y 35/00; B82Y 35/08; G01Q 70/16
USPC ........... 438/20, 746; 216/37; 313/309, 359, 1, 313/501, 509; 428/195.1, 209, 446
See application file for complete search history.

(56) References Cited

U.S. PATENT DOCUMENTS

| | | | |
|---|---|---|---|
| 7,431,856 B2* | 10/2008 | Rezeq et al. | 216/58 |
| 2004/0170928 A1* | 9/2004 | Herr et al. | 430/311 |

OTHER PUBLICATIONS

Wangh et al. World Academy of Science, Engineering and Technology, vol. 7, (Jan. 27, 2013), pp. 453-455).*
Khan et al. Reviews of Scientific Instruments, vol. 83, (2012) pp. 063708-1 to 063708-8.*
Moh'D Rezeq et al., Tungsten nanotip fabrication by spatially controlled field-assisted reaction with nitrogen, The Journal of Chemical Physics 124, May 31, 2006, pp. 204716-1 to 204716-6, 204716(2006), American Institute of Physics, Canada.

* cited by examiner

*Primary Examiner* — Duy Deo
*Assistant Examiner* — Maki Angadi
(74) *Attorney, Agent, or Firm* — Horizon IP Pte. Ltd.

(57) ABSTRACT

A method for sharpening a nanotip involving a laser-enhanced chemical etching is provided. The method includes immersing a nanotip in an etchant solution. The nanotip includes a base and an apex, the apex having a diameter smaller than a diameter of the base. The method also includes irradiating the nanotip with laser fluence to establish a temperature gradient in the nanotip along a direction from the apex to the base of the nanotip such that the apex and base are etched at different rates.

20 Claims, 7 Drawing Sheets

LASER-ENHANCED CHEMICAL ETCHING OF NANOTIPS

CROSS-REFERENCE TO RELATED APPLICATION

This application claims the priority benefit of U.S. Provisional Application Ser. No. 61/769,760, filed on Feb. 27, 2013, which is herein incorporated by reference in its entirety.

BACKGROUND

Nanotips are widely used in various fields including nano-device measurement and characterization, scanning tunneling microscopy, conductive atomic force microscope (AFM), nanofabrication, nanolithography, biosensing, etc. Nanotips can be made from conductive materials such as tungsten, highly doped silicon, and precious metals. Alternatively, a nanotip may be composed of a non-conductive body coated with one or more layers of conductive materials. Due to its robustness and high density, its characteristic of being amenable to chemical etching, tunable tip geometric shape, highest melting point of all the non-alloyed metals, and relatively good oxidation resistance in air, tungsten (W) nanotip is one of the most favored conductive nanotips. Typically, nanotip apex sharpness and geometric shape requirements vary depending on the specific context in which a nanotip is applied. The sharpness of a nanotip is measured by the radius of curvature (ROC) at the apex, also known as apex radius. In general, the sharper the nanotip apex is, the smaller the ROC. The apex radius of commercially available nanotips ranges typically from about 50 to 70 nm.

Nanoprobing is a valuable tool for electrical failure analysis (FA) in current FA metrology for fault isolation. A nanoprobing system typically includes a scanning electron microscopy (SEM) or an AFM integrated with four to eight nanomanipulators with nanotips, which are connected to a parametric analyzer. Such a system is capable of direct transistor characterization at the contact level. Yet, the minimum device size tends to decrease with further progression in transistor scaling. This requires nanotips with sufficiently small ROC to serve as probes in a nanoprobing system. Currently, no commercially available nanotips can be used for probing, for example, 14 nm and 10 nm technology node devices.

Various tip sharpening methodologies have been developed with different technologies including field emission deposition, oxidation in oxygen environment or high electrical field in air, chemical reverse etching, etc. However, these methodologies require complicated or expensive setups and suffer from poor repeatability and low yield.

Accordingly, there remains a need to develop a low-cost method for fabricating sharp nanotips.

SUMMARY

Embodiments generally relate to nanotips, methods for sharpening nanotips and use of nanotips in, for example, nanoprobing on semiconductor devices, etc.

In one aspect, a method of forming an integrated circuit (IC) device is disclosed. The method includes sharpening a nanotip by immersing the nanotip in an etchant. The nanotip includes a base and an apex. The apex having a diameter smaller than a diameter of the base. The nanotip is irradiated with laser fluence to establish a temperature gradient in the nanotip along a direction from the apex to the base of the nanotip such that the apex and base are etched at different rates. The method also performs front-end-of-line (FEOL) processing of an IC manufacturing process for a wafer. The method performs wafer metrology on the wafer using the sharpened nanotip to measure performance of transistors on the wafer. The method further performs back-end-of-line (BEOL) processing of the IC manufacturing process for the wafer.

The laser fluence may be irradiated on the nanotip in a direction from the apex to the base.

The laser fluence may be irradiated on the nanotip in a plurality of pulses.

The etching of the nanotip between the pulses may be minimal.

The diameter of the apex may be at least several times smaller than a wavelength of the laser fluence.

The diameter of the base may be at least several times larger than a wavelength of the laser fluence.

The nanotip may have a conical shape.

The nanotip may be made of tungsten (W), gold (Au), tantalum (Ta), iron (Fe), platinum (Pt), iridium (Ir), or platinum-Iridium (Pt—Ir).

The etchant may be a potassium hydroxide (KOH) solution, a sodium hydroxide (NaOH) solution, an ammonium hydroxide ($NH_4OH$) solution, or a combination thereof.

The laser fluence may comprise a green laser with a wavelength of about 532 nm.

In another embodiment, a method of sharpening a nanotip is presented. The method includes immersing a nanotip in an etchant and irradiating the nanotip with a laser beam along an axial direction of the nanotip to sharpen the nanotip. The nanotip may have a tapered shape with an apex and a base. The nanotip may be immersed in the etchant in a substantially upright orientation with the apex of the nanotip pointing toward a surface of the etchant. The apex of the nanotip may have a dimension substantially smaller than a wavelength of the laser beam. The base of the nanotip may have a dimension substantially larger than the wavelength of the laser beam.

The nanotip may be made of tungsten (W), gold (Au), tantalum (Ta), iron (Fe), platinum (Pt), iridium (Ir), or platinum-Iridium (Pt—Ir).

The etchant may be a potassium hydroxide (KOH) solution, a sodium hydroxide (NaOH) solution, an ammonium hydroxide ($NH_4OH$) solution, or a combination thereof.

A radius of curvature of the nanotip after sharpening may be about 10 nm.

The laser beam may comprise a green laser with a wavelength of about 532 nm.

The laser beam may be pulsed.

The fluence and a pulse duration of the laser beam may be configured such that etching of the nanotip between pulses of the laser beam is minimal.

The nanotip may be prefabricated by a process comprising: immersing a portion of a conductive wire into an etchant; applying alternating current (AC) power to the conductive wire; and pulling the conductive wire out of the etchant at a fixed speed.

The conductive wire may be a polycrystalline wire made of tungsten (W), gold (Au), tantalum (Ta), iron (Fe), platinum (Pt), iridium (Ir), or platinum-Iridium (Pt—Ir).

The etchant may be a potassium hydroxide (KOH) solution, a sodium hydroxide (NaOH) solution, an ammonium hydroxide ($NH_4OH$) solution, or a combination thereof.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the present disclosure. In the following description, various embodiments of the present disclosure are described with reference to the following drawings, in which.

DETAILED DESCRIPTION

Embodiments generally relate nanotips, methods for sharpening of nanotips and use of the nanotips in, for example, nanoprobing on semiconductor devices, etc. Embodiments, for example, relate to the sharpening of nanotips by laser-enhanced chemical etching. We have discovered that the irradiation of a laser beam on a nanotip results in varying etching rates being established across the length of the nanotip. The etching rate is the highest at a region of the nanotip with the largest diameter and the lowest at a region of the nanotip with the smallest diameter. As a result of this variation in etching rate of the laser irradiation, the apex of the nanotip is sharpened.

Figure 1A:
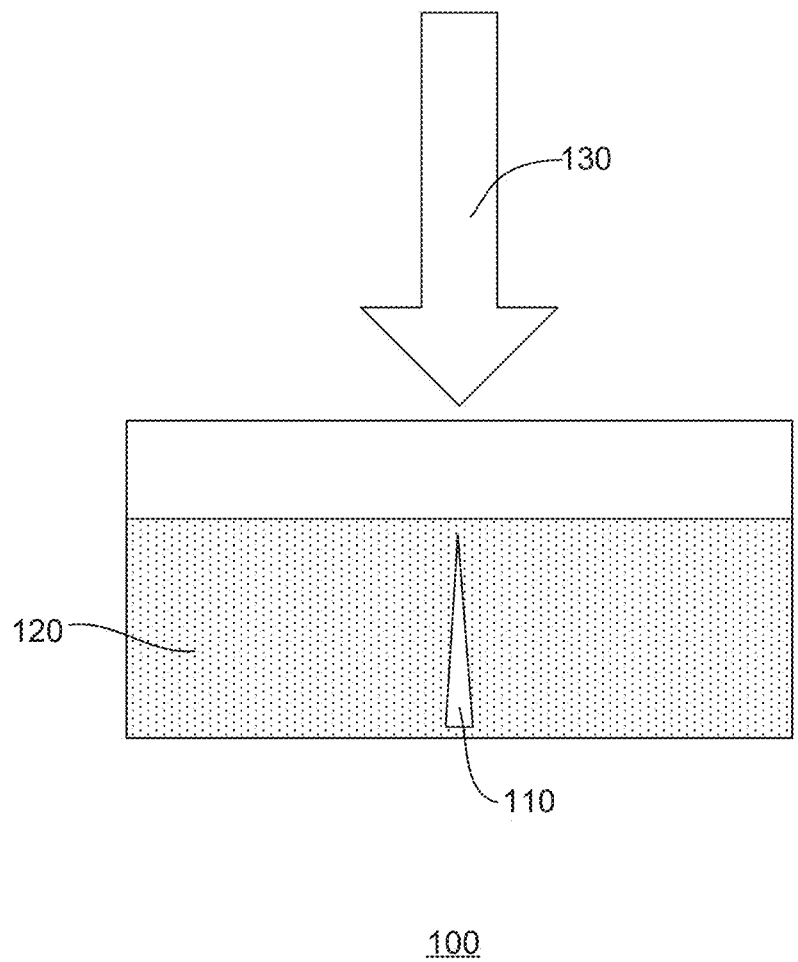
FIG. 1A is a cross-sectional view of an embodiment of a setup for laser-enhanced chemical etching.
Figure 1B:
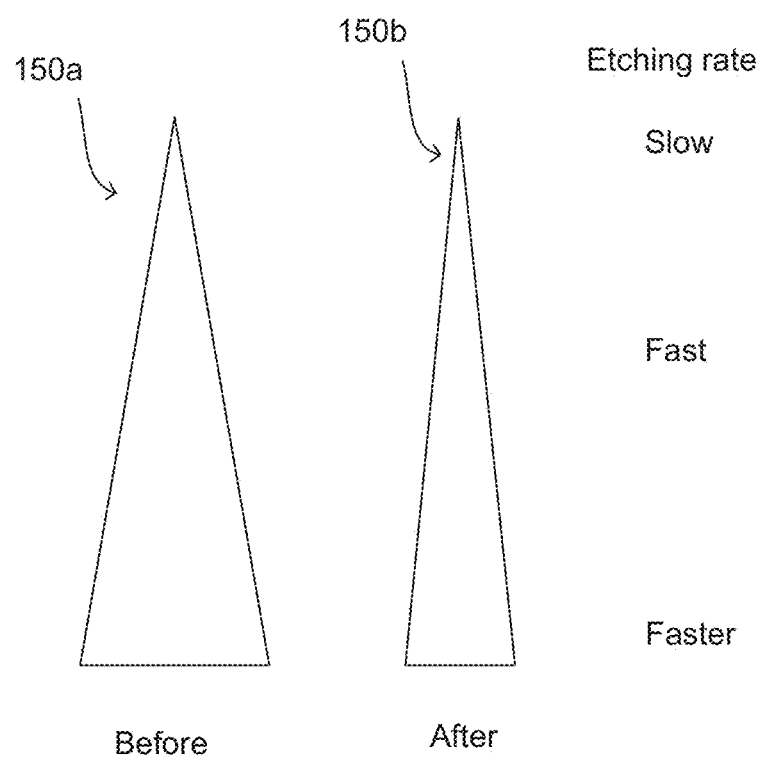
FIG. 1B is a cross-sectional view of an embodiment of a nanotip before and after laser-enhanced chemical etching.
Figure 2:
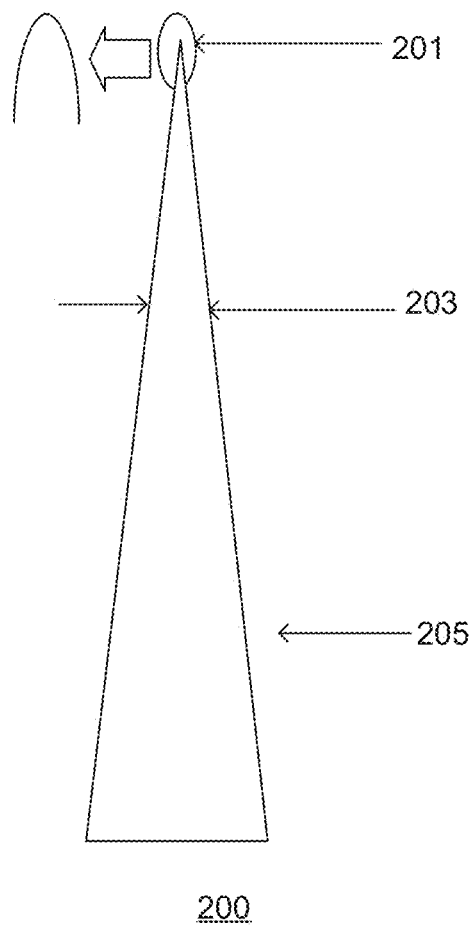
FIG. 2 is a cross-sectional view of the nanotip in FIG. 1B before laser enhanced etching with different portions of the nanotip identified.

FIGS. 1-2, by way of example and not by limitation, depict an exemplary process for sharpening a nanotip for illustrative purpose and are not to be construed as limitation. It is to be understood that a plurality of conventional processes that are well known in the art and not repeated herein, may precede or follow the process depicted in FIGS. 1-2. Moreover, it is to be understood that modifications, additions, and/or omissions may be made to the process described below without departing from the scope or spirit of the inventive concept of the present disclosure.

FIG. 1A is a cross-sectional view of an exemplary setup 100 for performing a laser irradiation enhanced chemical etching process to sharpen a nanotip 110. Referring to FIG. 1A, the setup 100 includes a conical-shaped nanotip 110 immersed in a chemical etchant 120. Preferably, the etching rate for the nanotip 110 in absence of laser irradiation is very low. The conical-shaped nanotip may be fabricated by methods known in the art. See, for example: Tip sharpening by normal and reverse electrochemical etching, Rev. Sci. Instrum. 64(1), 159-167 (1993), which is herein incorporated by reference. The nanotip 110 is positioned in a substantially upright orientation with its apex located at the top, i.e., pointing toward the surface of the etchant. A laser source is placed above the nanotip 110 to irradiate a laser beam 130 onto the nanotip 110 from the direction of the apex of the nanotip 110 toward the base of the nanotip 110. The laser source may include an optical lens system for directing and focusing the laser beam onto the nanotip 110. In FIG. 1A, the apex is aligned along the axis of the conical-shaped nanotip 110. Alternatively, the apex may be angled with respect to the axis of the conical-shaped nanotip 110. The nanotip 110 may be carried and positioned in the etchant by a tip holder.

The laser beam 130 causes different sections of the nanotip 110 to be etched at different rates, and the value of which depends on the local dimension of the respective section of the nanotip 110. In general, a different etching rate is utilized such that the larger the local diameter of a respective section is, the higher the etching rate. FIG. 1B shows the geometry and the dimension variation of a nanotip 150a before and a nanotip 150b after the laser-enhanced chemical etching. As observed from FIG. 1B, the non-uniform laser-enhanced etching of the nanotip results in a dramatic reduction in apex diameter; that is, the tip of the nanotip is sharpened.

When a beam of laser light irradiates on a nanotip, the energy of the laser beam may be reflected, absorbed, diffracted, and/or scattered. The interaction between the incident laser beam and the nanotip can vary locally depending on the relationship between the localized tip dimension and wavelength of the incident laser beam. This concept is illustrated with reference to FIG. 2, which is a schematic illustration of three different locations on nanotip 200 where different laser-nanotip interactions may occur. In general, light absorption decreases with a reduction in tip diameter particularly when the diameter is smaller than the incident laser wavelength. For example, location A 201, which is at the tip apex region, has a diameter that is at least several times smaller than the wavelength of the incident laser beam. As a result, most of the laser beam incident on location A 201 is reflected or scattered with little or no energy absorption. Since there is little or no absorption of laser energy at location A 201, the temperature rise at location A 201 due to the absorption of incident laser energy is low. In one embodiment, the diameter at location A 201 may be about 100 nm and the laser wavelength may be about 532 nm. At location B 203, where the tip diameter is proximate to the value of the incident laser wavelength, light diffraction dominates and the amount of incident beam absorption increases relative to location A 201. Since material temperature increases with the amount of light absorbed, the temperature at location B 203 will be higher than that at location A 201. Finally, at location C 205, where the local tip diameter is at least several times larger than the incident laser wavelength, light absorption and reflection dominate. This translates to a greater amount of laser energy being absorbed by the nanotip at location C 205 relative to location B 203. As a result of the increase in energy absorption with the increased tip dimension, a temperature gradient is developed across the length of the nanotip along the axis of the nanotip. Location C 205, with the largest diameter that can absorb the most incident laser energy, is the hottest among the three locations A, B and C, while location A 201, having the smallest diameter that only absorbs the least amount of energy, is the coolest. Since etching rate varies as a function of temperature, the chemical etching rate along the nanotip when subjected to the laser fluence will also vary based on the temperature gradient established from the tip bulk (fast etch) to tip apex (slow etch). This variation in etching rate results in the tip apex being sharpened as shown in FIG. 1B. By contrast, a nanotip that is simply immersed in a chemical etchant with no laser irradiation will have a substantially uniform temperature profile along its length. Consequently, the etching rate will be uniform throughout the nanotip or even progress at a higher rate at the tip apex since the apex is a sharp point. As a result, in the conventional non-laser enhanced chemical etching, the tip apex in the nanometer scale will end up being rounded instead of being pointed.

Techniques of the present disclosure may be applied to sharpen nanotips made of tungsten (W), gold (Au), tantalum (Ta), iron (Fe), platinum (Pt), iridium (Ir) and platinum-Iridium (Pt—Ir). Techniques of the present disclosure may also be applied to nanotips made of other suitable types of materials. In one embodiment, a tungsten nanotip is sharpened. The chemical etchant used may vary depending on the tip material being etched. In one embodiment, a diluted KOH solution with a concentration of 0.5 M is used as the etchant. Other suitable types of chemical etchant may also be used.

It should be appreciated by those with ordinary skilled in the art that laser sources having other wavelength values may be used to irradiate the nanotip so long as a sufficiently high percentage of incident laser energy can be absorbed by the nanotip material. This is because the percentage of incident laser energy absorbed by a specific material varies with wavelength. Additionally, the laser source chosen should also have the ability to be transmitted to the surface of the nanotip by penetrating through the chemical etchant. Preferably, the laser wavelength is chosen such that no significant laser energy is absorbed by the chemical etchant to prevent substantial increase in etchant temperature. In one embodiment, a green laser with a wavelength of about 532 nm is used to irradiate a W nanotip.

In a preferred embodiment, the laser beam is emitted in pulses, e.g., emitted in a number of pulses. The energy and duration of each pulse may be chosen such that there is sufficient energy in each pulse to heat up a useful volume of the nanotip thus establishing a temperature gradient while avoiding any melting of the tip apex. Laser energy absorbed by a material produces thermal energy that is diffused to a distance of L from the point of incident. This thermal diffusion length, L, is dependent on the thermal diffusivity of the nanotip material and duration of incident laser pulse width. Therefore, although location A 201 in FIG. 2 reflects or scatters almost all of the incident laser beam, it can nevertheless be heated via transmission of energy from hotter sections of the nanotip. Accordingly, to avoid melting of the apex, it may be preferable to achieve a desired apex radius via the application of multiple laser pulses each of a relatively short duration instead of a single laser pulse of a longer duration. In general, the greater the number of pulses, the smaller the ROC of the resulting nanotip will be. Through the laser-enhanced chemical etching, a nanotip with a ROC about 10 nm and a higher aspect ratio may be obtained.

Figure 3:
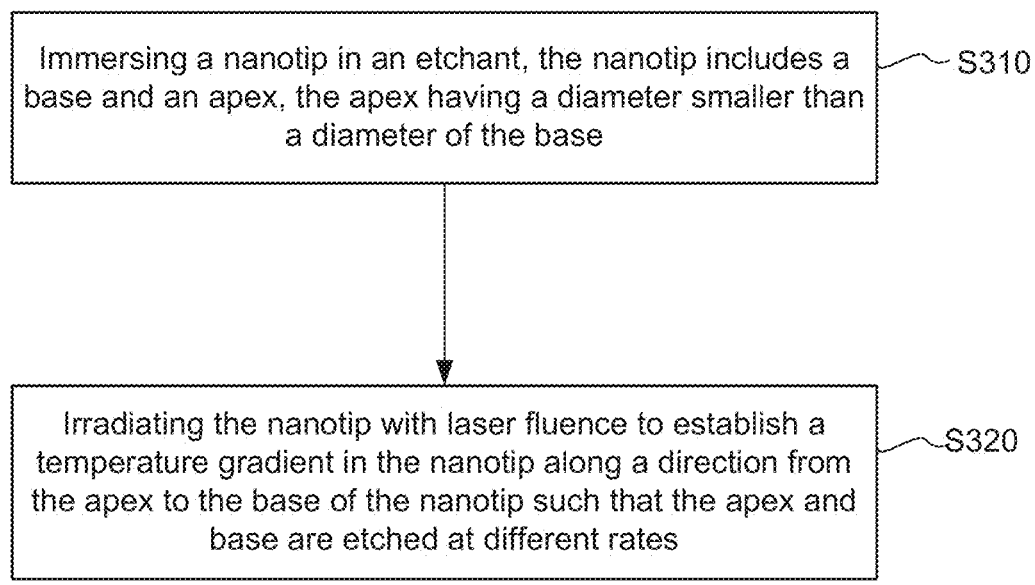
FIG. 3 is a flowchart illustrating an embodiment of a process for sharpening a nanotip.

FIG. 3 is a flowchart illustrating a method 300 for sharpening a nanotip 110 in accordance with one embodiment of the present disclosure. At S310, a nanotip 110 is immersed in an etchant 120. The nanotip 110 includes a base and an apex, and the apex has a diameter smaller than that of the base. At S320, the nanotip 110 is irradiated with laser fluence to establish a temperature gradient in the nanotip 110 along a direction from the apex to the base of the nanotip 110 such that the apex and base are etched at different rates.

Figure 4:
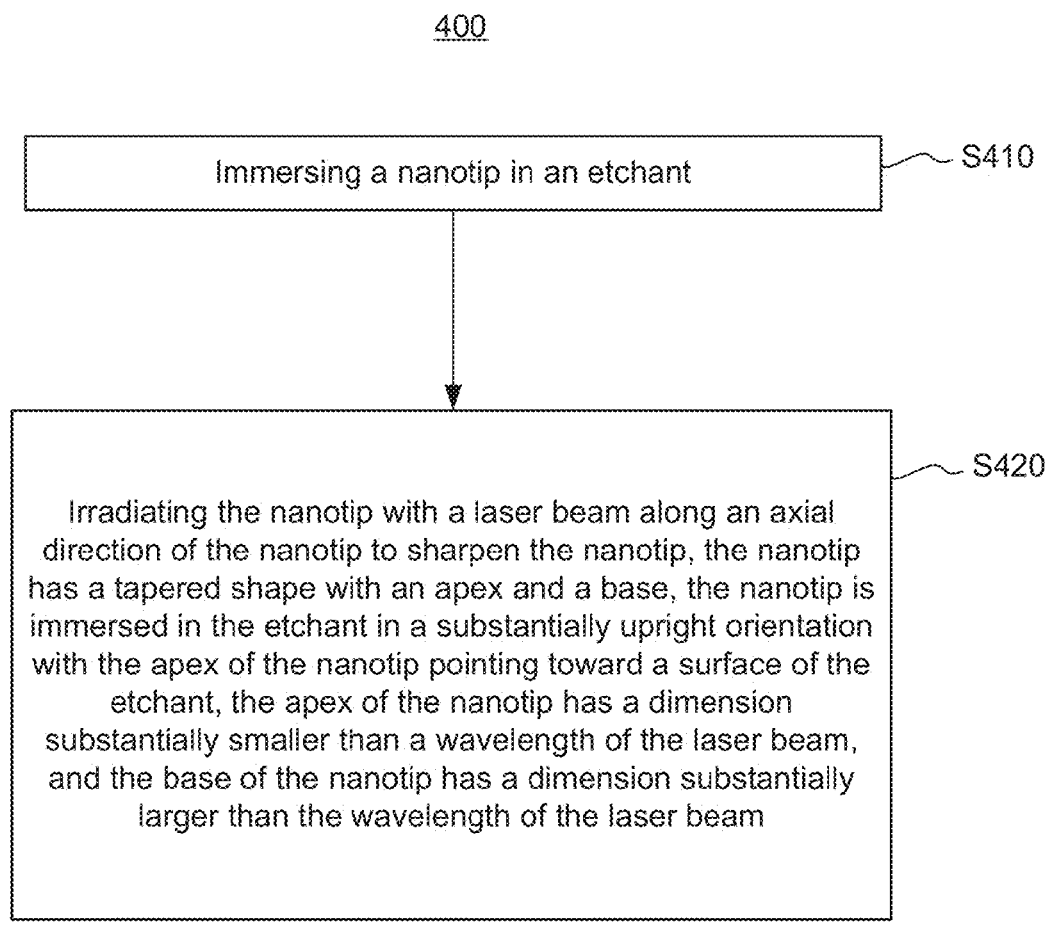
FIG. 4 is a flowchart illustrating an embodiment of a process for sharpening a nanotip.

FIG. 4 is a flowchart illustrating a method 400 for sharpening a nanotip 110 in accordance with another embodiment of the present disclosure. At S410, a nanotip 110 is immersed in an etchant. At S420, the nanotip 110 is irradiated with a laser beam along an axial direction of the nanotip 110 to sharpen the nanotip 110. The nanotip 110 has a tapered shape with an apex and a base, and is immersed in the etchant in a substantially upright orientation with the apex of the nanotip 110 pointing toward a surface of the etchant, e.g., toward top. The apex of the nanotip 110 has a dimension substantially smaller than a wavelength of the laser beam. The base of the nanotip 110 has a dimension substantially larger than the wavelength of the laser beam.

The nanotip 110 used in the above sharpening processes may be prefabricated by immersing a portion of a conductive wire into an etchant, then applying alternating current (AC) power to the conductive wire. Afterwards, the conductive wire is pulled out of the etchant at a fixed speed.

Figure 5A:
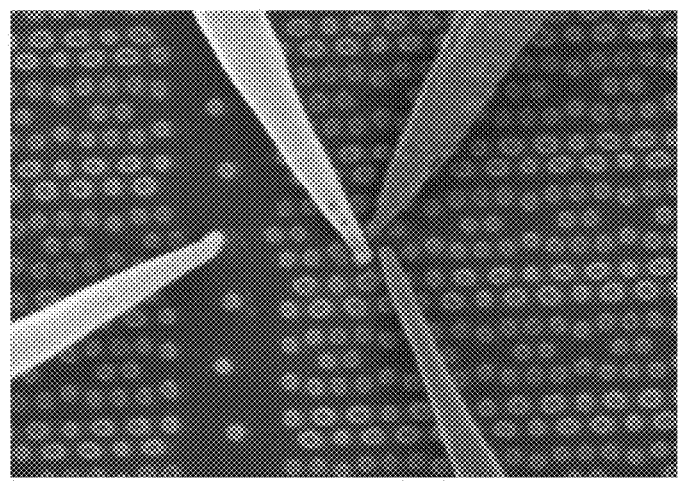
FIG. 5A is a SEM image of nanotips with 28 nm ROC landed on a pass-gate transistor of an SRAM cell.
Figure 5B:
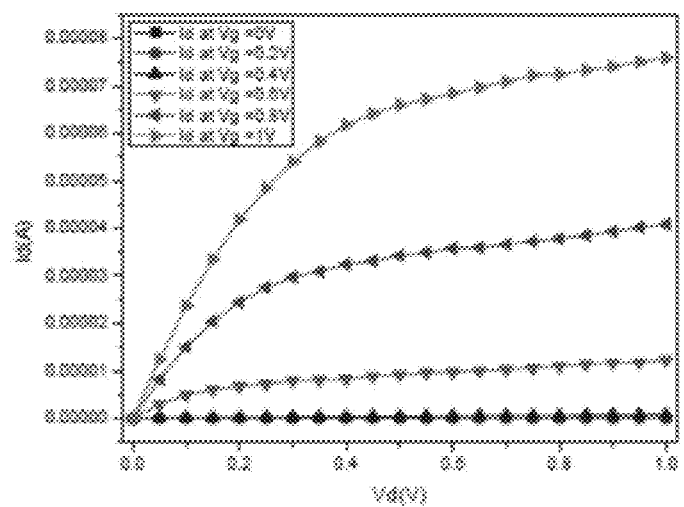
FIG. 5B is a drain current (Id) vs. drain voltage (Vd) plot of the pass-gate transistor of FIG. 3A.
Figure 5C:
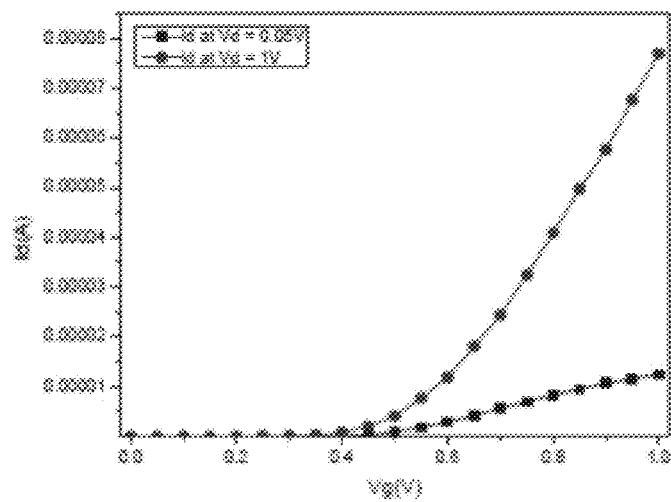
FIG. 5C is a drain current (Id) vs. gate voltage (Vd) plot of the pass-gate transistor of FIG. 3A.

The application of the fabricated nanotips for nanoprobing on an SRAM device was demonstrated using tungsten nanotips. The nanotips were mounted on a DCG nProber system which can accommodate up to eight nanotips. FIG. 5A shows a SEM image of the sharpened nanotips landed on tungsten contacts of the SRAM device. FIGS. 5B and 5C show the I-V measurements on a pass-gate transistor within a SRAM cell.

As nanoprobing is a valuable tool for electrical FA in current FA metrology for fault isolation, nanoprobing may be used as part of the manufacturing process of IC chips. More specifically, nanoprobing with nanotips sharpened or otherwise prepared according to the present disclosure may be utilized for wafer metrology to measure performance of transistors, for example, after tungsten chemical-mechanical polishing (W CMP) before processing the wafer for BEOL processing, during which individual electronic components of the IC are interconnected with wiring on the wafer. That is, wafer metrology with nanoprobing may be performed after the front-end-of-line processing (FEOL), during which transistors are formed on the wafer, and before the BEOL processing of the IC manufacturing process. Moreover, information obtained from wafer metrology with nanoprobing may be used to modify the process conditions or parameters in the IC manufacturing process. For example, decision on "go" or "no go" for wafer lots may be made based at least in part on nanoprobing results at conformity assessment (CA) level.

The following examples are provided for the purpose of illustrating, not limiting, the present disclosure.

EXAMPLE FABRICATION OF TUNGSTEN (W) NANOTIP

A two-step etching process was used to fabricate a W nanotip with controllable ROC. In the first step, a W nanotip with a ROC around 40 nm was formed by a downward AC electrochemical etching in a dilute KOH solution (e.g., 0.5 M) with an integrated lift-up etching process. A W wire with a diameter of about 0.25 mm was first loaded into a wire holder where about 3 mm of the wire was submerged into KOH solution. An AC power supply of 13.5 V, 50 Hz was then applied. The current change during the etching process was monitored. At a sudden drop in current, the wire was lifted at a fixed pull-up speed with the help of, for example, a motorized stage. The morphology of the resulting nanotip is dependent on the reaction kinetics between $OH^-$, $WO_4^{2-}$ and the density of H2 bubbles at the tip surface. The lifting step during the AC etching was found to increase tip sharpness due to a shielding effect from $OH^-$ ions.

Figure 6:
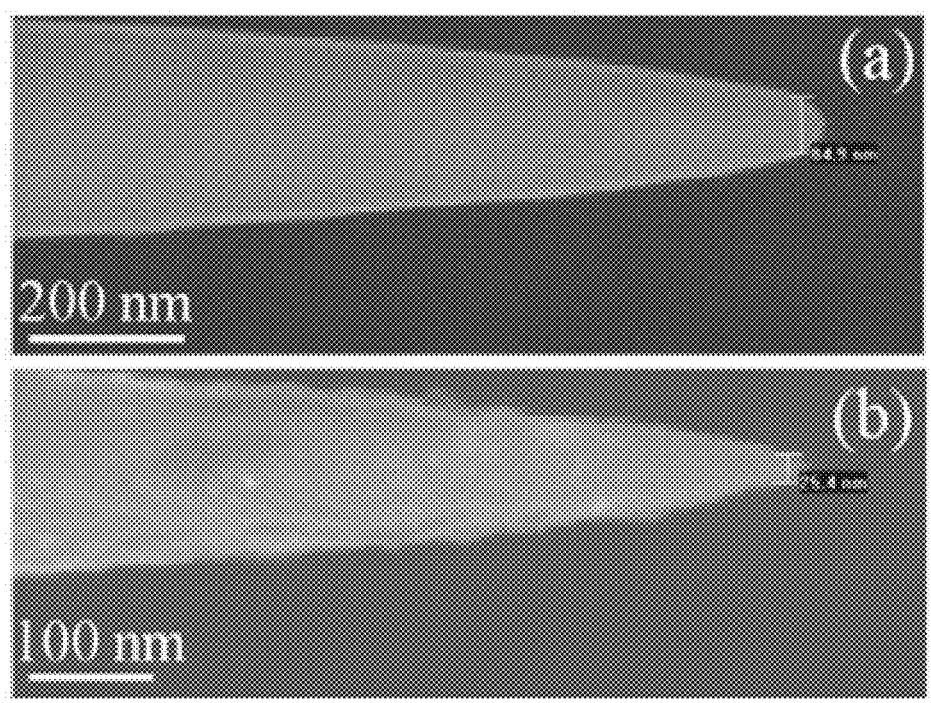
FIG. 6 is SEM images of a tungsten nanotip before (a) and after (b) laser-enhanced chemical treatment.

The resulting nanotip was then subjected to a laser-enhanced chemical etching process in a KOH solution. The nanotip was placed normal to the direction of incident laser irradiation in a 0.5M KOH bath. A green (532 nm) Nd:YAG laser source with pulse duration of 6 ns was irradiated to the W nanotip along the axial direction. The maximum output energy of the laser source is around 0.6 mJ. After laser irradiation, the tip apex radius was reduced from about 40 nm to about 10 nm, as shown in FIG. 6. The aspect ratio of the nanotip is also enhanced.

The present disclosure may be embodied in other specific forms without departing from the spirit or essential characteristics thereof. The foregoing embodiments, therefore, are to be considered in all respects illustrative rather than limiting the present disclosure described herein. Scope of the present disclosure is thus indicated by the appended claims, rather than by the foregoing description, and all changes that come within the meaning and range of equivalency of the claims are intended to be embraced therein.

What is claimed is:

1. A method of forming an integrated circuit (IC) device, comprising:
    sharpening a nanotip, the sharpening comprising:
        immersing the nanotip in an etchant, the nanotip comprising a base and an apex, the apex having a diameter smaller than a diameter of the base, and
        irradiating the nanotip with laser fluence to establish a temperature gradient in the nanotip along a direction from the apex to the base of the nanotip such that the apex and base are etched at different rates;
    performing wafer metrology on a wafer having a plurality of devices using the sharpened nanotip to measure device performance.

2. The method of claim 1 wherein the laser fluence is irradiated on the nanotip in a direction from the apex to the base.

3. The method of claim 1 wherein the laser fluence is irradiated on the nanotip in a plurality of pulses.

4. The method of claim 3 wherein:
    the plurality of pulses are of a relatively short duration; and
    etching of the nanotip between the pulses is minimal.

5. The method of claim 1 wherein the diameter of the apex is at least several times smaller than a wavelength of the laser fluence.

6. The method of claim 1 wherein the diameter of the base is at least several times larger than a wavelength of the laser fluence.

7. The method of claim 1 wherein the nanotip has a conical shape.

8. The method of claim 1 wherein the nanotip is made of tungsten (W), gold (Au), tantalum (Ta), iron (Fe), platinum (Pt), iridium (Ir), or platinum-Iridium (Pt—Ir).

9. The method of claim 1 wherein the etchant is a potassium hydroxide (KOH) solution, a sodium hydroxide (NaOH) solution, an ammonium hydroxide (NH4OH) solution, or a combination thereof.

10. The method of claim 1 wherein the laser fluence comprises a green laser with a wavelength of about 532 nm.

11. A method of sharpening a nanotip, comprising:
    immersing the nanotip in an etchant; and
    irradiating the nanotip with a laser beam along an axial direction of the nanotip to sharpen the nanotip,
    wherein the nanotip has a tapered shape with an apex and a base,
    wherein the nanotip is immersed in the etchant in a substantially upright orientation with the apex of the nanotip pointing toward a surface of the etchant,
    wherein the apex of the nanotip has a dimension substantially smaller than a wavelength of the laser beam, and
    wherein the base of the nanotip has a dimension substantially larger than the wavelength of the laser beam.

12. The method of claim 11 wherein fluence and a pulse duration of the laser beam are configured such that etching of the nanotip between pulses of the laser beam is minimal.

13. The method of claim 11 wherein the nanotip is made of tungsten (W), gold (Au), tantalum (Ta), iron (Fe), platinum (Pt), iridium (Ir), or platinum-Iridium (Pt—Ir).

14. The method of claim 11 wherein the etchant is a potassium hydroxide (KOH) solution, a sodium hydroxide (NaOH) solution, an ammonium hydroxide (NH4OH) solution, or a combination thereof.

15. The method of claim 11 wherein a radius of curvature of the nanotip after sharpening is about 10 nm.

16. The method of claim 11 wherein the laser beam comprises a green laser with a wavelength of about 532 nm.

17. The method of claim 11 wherein the laser beam is emitted in a number of pulses in short durations.

18. The method of claim 11 wherein the nanotip is prefabricated by a process comprising:
    immersing a portion of a conductive wire into an etchant;
    applying alternating current (AC) power to the conductive wire; and
    at a sudden drop in current, pulling the conductive wire out of the etchant at a fixed pull-up speed.

19. The method of claim 18 wherein the conductive wire is a polycrystalline wire made of tungsten (W), gold (Au), tantalum (Ta), iron (Fe), platinum (Pt), iridium (Ir), or platinum-Iridium (Pt—Ir).

20. The method of claim 18 wherein the etchant is a potassium hydroxide (KOH) solution, a sodium hydroxide (NaOH) solution, an ammonium hydroxide (NH4OH) solution, or a combination thereof.

* * * * *